(12) United States Patent
Mabuchi et al.

(10) Patent No.: US 9,312,300 B2
(45) Date of Patent: Apr. 12, 2016

(54) SOLID-STATE IMAGING DEVICE, METHOD OF MANUFACTURING THE SAME, AND ELECTRONIC APPARATUS

(71) Applicant: Sony Corporation, Tokyo (JP)

(72) Inventors: Keiji Mabuchi, Kanagawa (JP); Hideshi Abe, Kanagawa (JP); Hideo Kanbe, Kanagawa (JP); Shiro Uchida, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/524,182

(22) Filed: Oct. 27, 2014

(65) Prior Publication Data

US 2015/0122995 A1    May 7, 2015

(30) Foreign Application Priority Data

Nov. 1, 2013    (JP) .................................. 2013-228328

(51) Int. Cl.
| | |
|---|---|
| *H01L 31/062* | (2012.01) |
| *H01L 31/113* | (2006.01) |
| *H01L 27/146* | (2006.01) |
| *G01J 5/20* | (2006.01) |

(52) U.S. Cl.
CPC ............. *H01L 27/14652* (2013.01); *G01J 5/20* (2013.01); *H01L 27/1464* (2013.01); *H01L 27/14683* (2013.01)

(58) Field of Classification Search
CPC ............ H01L 27/1464; H01L 27/1463; H01L 27/14609; H01L 27/14643; H01L 27/14649; H01L 27/14676
See application file for complete search history.

(56) References Cited

U.S. PATENT DOCUMENTS

| | | | |
|---|---|---|---|
| 2002/0135035 A1* | 9/2002 | Yamaguchi | H01L 31/1035 257/440 |
| 2011/0019050 A1* | 1/2011 | Yamashita | H01L 27/1463 348/308 |
| 2012/0175719 A1* | 7/2012 | Suzuki | H01L 27/14609 257/432 |
| 2013/0057699 A1* | 3/2013 | Ooki | H01L 27/14621 348/164 |
| 2013/0083214 A1* | 4/2013 | Nakata | H01L 27/14618 348/222.1 |
| 2015/0146056 A1* | 5/2015 | Hirota | H04N 5/23212 348/294 |

FOREIGN PATENT DOCUMENTS

| | | |
|---|---|---|
| JP | 2004-103964 A | 4/2004 |
| JP | 3759435 B2 | 1/2006 |

* cited by examiner

*Primary Examiner* — Mohsen Ahmadi
(74) *Attorney, Agent, or Firm* — Sheridan Ross P.C.

(57) ABSTRACT

A solid-state imaging device includes an Si substrate in which a photoelectric conversion unit that photoelectrically converts visible light incident from a back surface side is formed, and a lower substrate provided under the Si substrate and configured to photoelectrically convert infrared light incident from the back surface side.

15 Claims, 13 Drawing Sheets

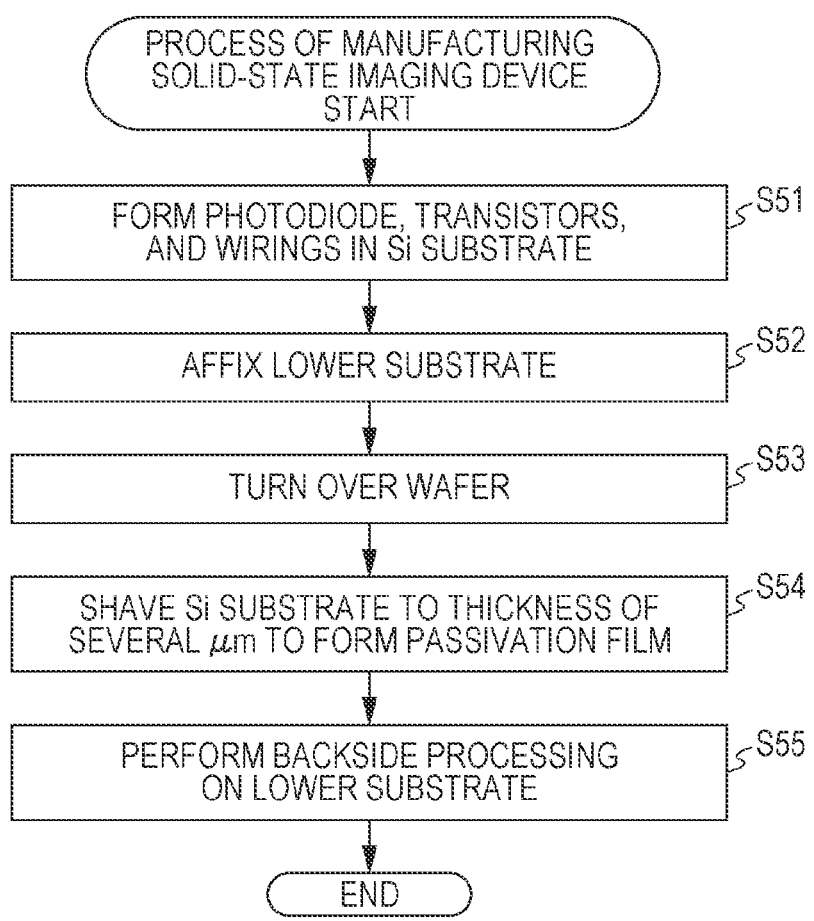

SOLID-STATE IMAGING DEVICE, METHOD OF MANUFACTURING THE SAME, AND ELECTRONIC APPARATUS

CROSS REFERENCE TO RELATED APPLICATIONS

This application claims the benefit of Japanese Priority Patent Application JP 2013-228328 filed Nov. 1, 2013, the entire contents of which are incorporated herein by reference.

BACKGROUND

The present disclosure relates to a solid-state imaging device, a method of manufacturing the same, and an electronic apparatus, and more particularly, to a solid-state imaging device, a method of manufacturing the same, and an electronic apparatus that enable infrared light and visible light to be separately obtained.

In Japanese Unexamined Patent Application Publication No. 2004-103964, a substrate for infrared light reception is affixed to a back surface of a solid-state imaging element, and a switch is switched to an infrared mode to obtain infrared rays through bias, as proposed.

Meanwhile, in a CMOS image sensor (hereinafter, the CMOS image sensor is referred to as a CIS) of a backside illumination type, a substrate with a wiring layer is turned over to affix a substrate support. In the backside illumination type CIS, a wafer is polished by chemical mechanical polishing (CMP) to form a silicon (Si) layer having a thickness of about 10 μm to 20 μm (see Japanese Patent No. 3759435). Currently, the Si layer has a thickness of several μm, and a normal Si wafer is used for the substrate support.

SUMMARY

However, in the former solid-state imaging element, it is difficult to separately obtain visible light and infrared light since there is no circuit between two substrates. In addition, in the latter backside illumination type CIS, since the Si layer is thin, the visible light is obtained. However, it is difficult to obtain the infrared light.

It is desirable to separately obtain visible light and infrared light.

According to an embodiment of the present technology, there is provided a solid-state imaging device including an Si substrate in which a photoelectric conversion unit that photoelectrically converts visible light incident from a back surface side is formed; and a lower substrate provided under the Si substrate and configured to photoelectrically convert infrared light incident from the back surface side.

The lower substrate is formed of a compound semiconductor.

An infrared electrode comes in contact with the Si substrate side of the lower substrate, and a lower electrode comes in contact with the outer side of the lower substrate.

A visible light reading circuit configured to read the visible light and an infrared light reading circuit configured to read the infrared light are formed in the Si substrate.

The infrared electrode is formed in a ring shape.

The visible light reading circuit and the infrared light reading circuit are formed in a position substantially overlapping the infrared electrode.

The infrared electrode is formed to be transparent.

The lower substrate is formed of silicon, and includes transistors and wirings.

The lower substrate is an n-type substrate.

The Si substrate and the lower substrate form a laminated structure.

A visible light reading circuit configured to read the visible light is formed in the Si substrate, and an infrared light reading circuit configured to read the infrared light is formed in the lower substrate.

The infrared light reading circuit is provided in a position substantially overlapping the visible light reading circuit.

According to another embodiment of the present technology, there is provided a method of manufacturing a solid-state imaging device, the method including: forming, by a manufacturing device, a photoelectric conversion unit that photoelectrically converts visible light incident from a back surface side, in an Si substrate; and affixing, by a manufacturing device, a lower substrate that photoelectrically converts infrared light incident from the back surface side, under the Si substrate.

According to still another embodiment of the present technology, there is provided an electronic apparatus including: a solid-state imaging device including an Si substrate in which a photoelectric conversion unit that photoelectrically converts visible light incident from a back surface side is formed, and a lower substrate provided under the Si substrate and configured to photoelectrically convert infrared light incident from the back surface side; a signal processing circuit configured to process an output signal output from the solid-state imaging device; and an optical system configured to cause the visible light and the infrared light to be incident on the solid-state imaging device.

The lower substrate is formed of a compound semiconductor.

An infrared electrode comes in contact with the Si substrate side of the lower substrate, and a lower electrode comes in contact with the outer side of the lower substrate.

A visible light reading circuit configured to read the visible light and an infrared light reading circuit configured to read the infrared light are formed in the Si substrate.

The infrared electrode is formed in a ring shape.

The visible light reading circuit and the infrared light reading circuit are formed in a position substantially overlapping the infrared electrode.

The infrared electrode is formed to be transparent.

The lower substrate is formed of silicon, and includes transistors and wirings.

In the embodiment of the present technology, the photoelectric conversion unit that photoelectrically converts the visible light incident from the back surface side is formed in the Si substrate, and the lower substrate that photoelectrically converts the infrared light incident from the back surface side is affixed under the Si substrate.

In the other embodiment of the present technology, an output signal output from the solid-state imaging device in which the photoelectric conversion unit that photoelectrically converts the visible light incident from the back surface side is formed in the Si substrate and the lower substrate that photoelectrically converts the infrared light incident from the back surface side is affixed under the Si substrate is processed by the signal processing circuit, and the visible light and the infrared light are incident on the solid-state imaging device through the optical system.

According to the embodiments of the present technology, it is possible to obtain the visible light and the infrared light. Further, according to the embodiments of the present technology, it is possible to separately obtain the visible light and the infrared light.

In addition, the effects described in the present specification are only illustrative, and the effects of the present tech-

BRIEF DESCRIPTION OF THE DRAWINGS

FIG. 8 is a flowchart illustrating a process of manufacturing a solid-state imaging device;

DETAILED DESCRIPTION OF EMBODIMENTS

Hereinafter, forms for carrying out the present disclosure (hereinafter referred to as embodiments) will be described. In addition, description will be given in the following order.

0. Example of schematic configuration of solid-state imaging device
1. First embodiment (backside illumination type CIS (CMOS image sensor))
2. Second embodiment (backside illumination type laminated CIS)
3. Third embodiment (electronic apparatus)

0. Example of Schematic Configuration of Solid-State Imaging Device

Example of Schematic Configuration of Solid-State Imaging Device

Figure 1:
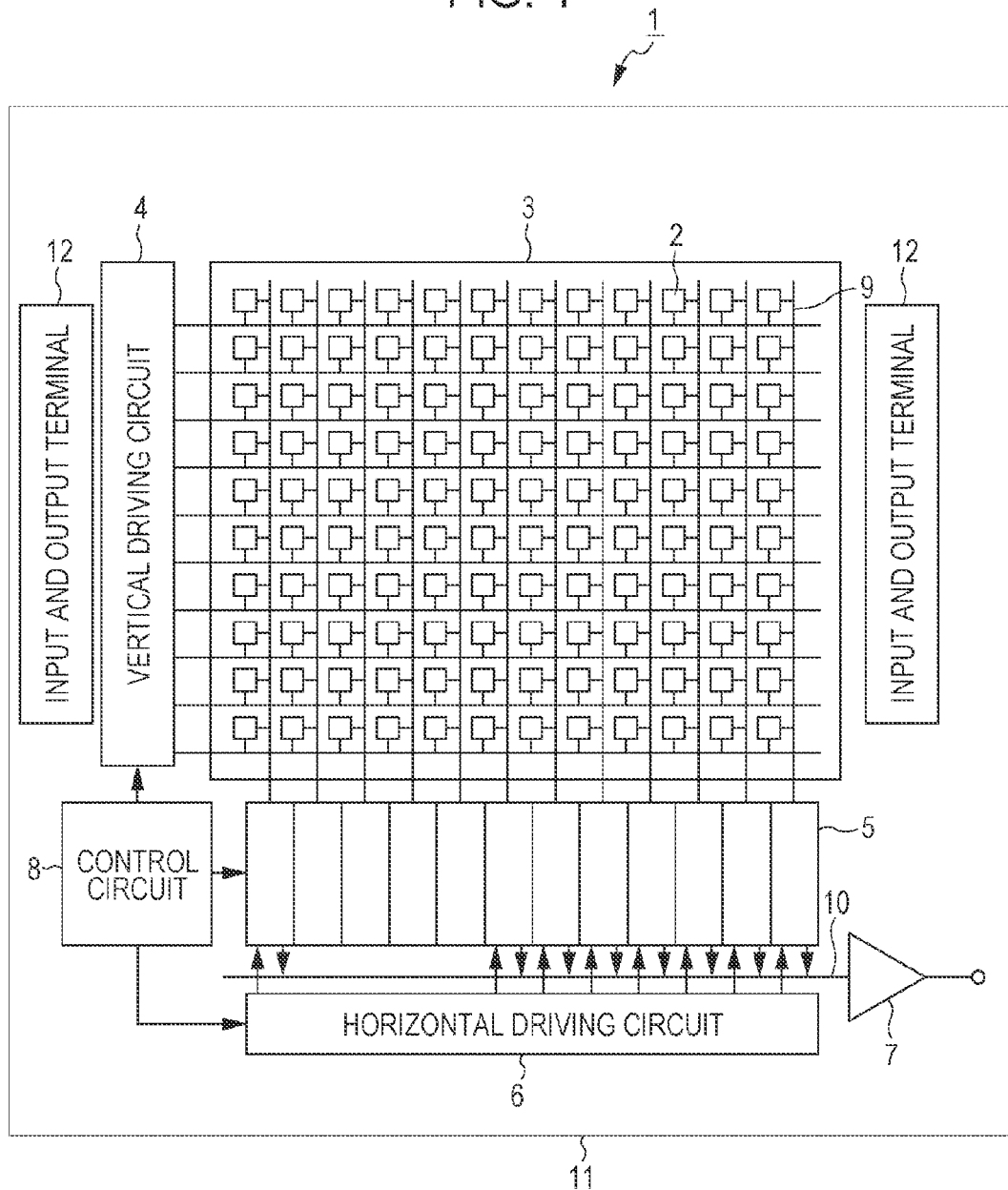
FIG. 1 is a block diagram illustrating an example of a schematic configuration of a solid-state imaging device to which an embodiment of the present technology is applied.

FIG. 1 illustrates an example of a schematic configuration of an example of a CMOS (Complementary Metal Oxide Semiconductor) solid-state imaging device applied to each embodiment of the present technology.

A solid-state imaging device (element chip) 1 includes a pixel area (so-called imaging area) 3 in which a plurality of pixels 2 each including a photoelectric conversion element are arranged regularly two-dimensionally in a semiconductor substrate 11 (for example, a silicon substrate), and a peripheral circuit portion, as illustrated in FIG. 1.

The pixel 2 includes the photoelectric conversion element (for example, a photodiode), and a plurality of pixel transistors (so-called MOS transistors). The plurality of pixel transistors, for example, can include three transistors of a transfer transistor, a reset transistor and an amplification transistor or can include four transistors, including a selection transistor in addition to the three transistors. Since an equivalent circuit of each pixel (unit pixel) 2 is the same as a general one, detailed description will be omitted herein.

In addition, the pixel 2 can also have a pixel-shared structure. The pixel-shared structure includes a plurality of photodiodes, a plurality of transfer transistors, one shared floating diffusion, and one shared one of each of other pixel transistors.

The peripheral circuit portion includes a vertical driving circuit 4, column signal processing circuits 5, a horizontal driving circuit 6, an output circuit 7, and a control circuit 8.

The control circuit 8 receives an input clock or data indicating, for example, a mode of operation, and outputs data such as internal information of the solid-state imaging device 1. Specifically, the control circuit 8 generates a clock signal or a control signal that is a reference of operations of the vertical driving circuit 4, the column signal processing circuits 5, and the horizontal driving circuit 6 based on a vertical synchronizing signal, a horizontal synchronization signal, and a master clock. Also, the control circuit 8 inputs these signals to the vertical driving circuit 4, the column signal processing circuits 5, and the horizontal driving circuit 6.

The vertical driving circuit 4 includes, for example, a shift register, and selects a pixel driving wiring and supplies a pulse for driving the pixel 2 to the selected pixel driving wiring to drive the pixels 2 in units of rows. Specifically, the vertical driving circuit 4 selectively scans the respective pixels 2 of the pixel area 3 in the vertical direction sequentially in units of rows, and supplies a pixel signal to the column signal processing circuit 5 based on signal charges generated according to an amount of light reception in the photoelectric conversion element of each pixel 2 through a vertical signal line 9.

The column signal processing circuit 5 is arranged in, for example, each column of the pixels 2, and performs signal processing such as noise reduction in each column on signals output from the pixels 2 in one row. Specifically, the column signal processing circuit 5 performs signal processing such as correlated double sampling (CDS) for removing a fixed pattern noise specific to the pixel 2, signal amplification, and analog/digital (A/D) conversion. A horizontal selective switch (not illustrated) is connected and provided between an output stage of the column signal processing circuit 5 and a horizontal signal line 10.

The horizontal driving circuit 6 includes, for example, a shift register, and sequentially outputs horizontal scanning pulses to sequentially select the respective column signal processing circuits 5, and outputs a pixel signal from each of the column signal processing circuits 5 to the horizontal signal line 10.

The output circuit 7 performs signal processing on the signals supplied sequentially through the horizontal signal line 10 from the respective column signal processing circuits 5, and outputs a resultant signal. The output circuit 7 may perform, for example, only buffering or may perform, for example, black level adjustment, column variation correction, or various digital signal processing.

An input and output terminal 12 is provided to exchange signals with the outside.

Example of Cross-Section of Solid-State Imaging Device

Figure 2:
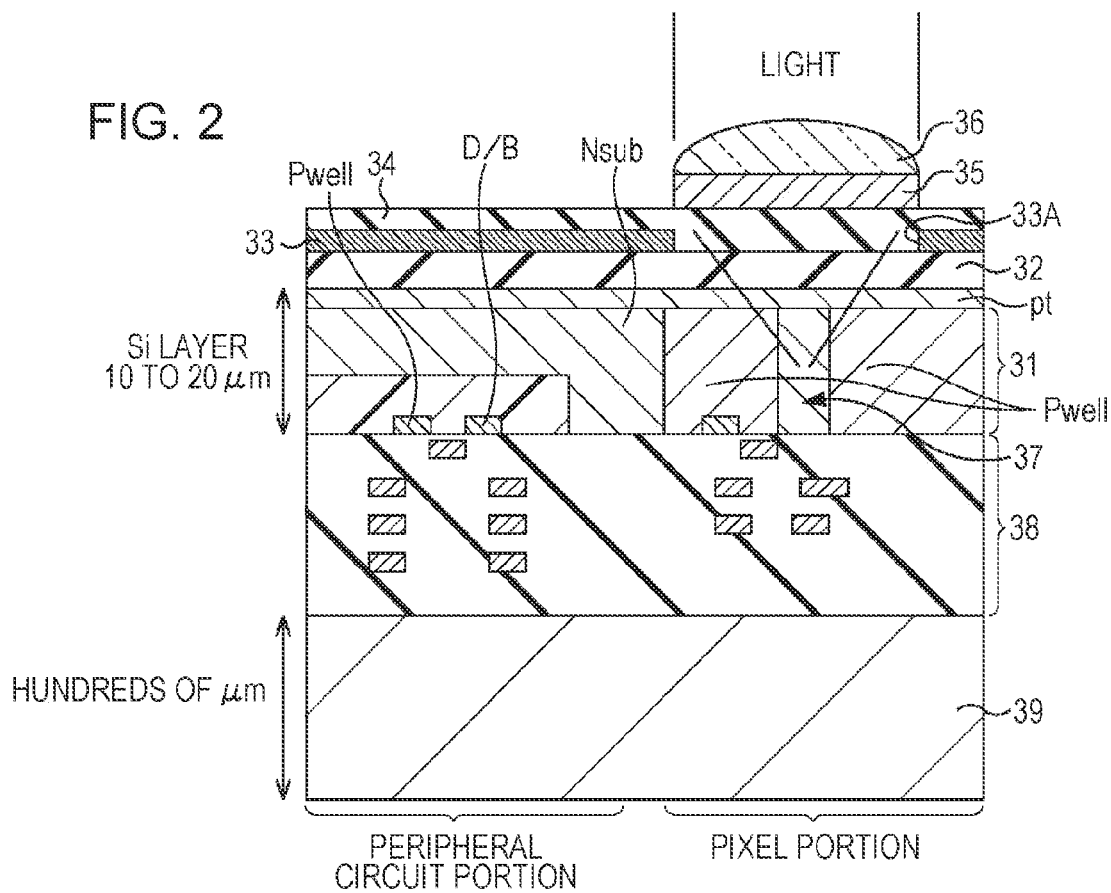
FIG. 2 is a cross-sectional view illustrating an example of a structure of a pixel area and a peripheral circuit portion of a solid-state imaging device of a backside illumination type.

FIG. 2 is a cross-sectional view illustrating an example of a structure of the pixel area and the peripheral circuit portion of the solid-state imaging device. In the example of FIG. 2, an example of the solid-state imaging device of a backside illumination type is shown.

In the solid-state imaging device of FIG. 2, a wafer is polished by chemical mechanical polishing (CMP) to form a silicon (Si) layer (an element layer) 31 having a current thickness of about 3 µm. A light shielding film 33 is formed on one-surface side of this Si layer with an $SiO_2$ film 32 interposed therebetween.

The light shielding film 33 is laid out in consideration of only an optical element, unlike wirings. An opening 33A is formed in this light shielding film 33. A silicon nitride film (SiN) 34 is formed as a passivation film on the light shielding film 33, and a color filter 35 and an on-chip lens (OCL) 36 are formed over the opening 33A.

In other words, this is a pixel structure in which light incident from the one-surface side of the Si layer 31 is guided to a light receiving surface of a photodiode 37 formed in the Si layer 31 via the OCL 36 and the color filter 35. A wiring layer 38 in which transistors or metal wirings are formed is formed on the other-surface side of the Si layer 31, and a substrate support 39 is affixed beneath the wiring layer 38.

1. First Embodiment

Backside Illumination Type CIS

Example of Configuration of Pixel of Solid-State Imaging Device

Figure 3:
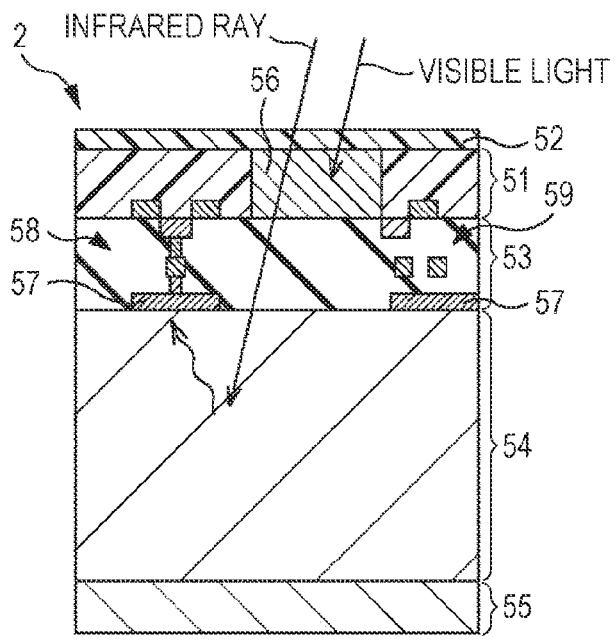
FIG. 3 is a cross-sectional view illustrating an example of a configuration of a pixel of a solid-state imaging device of an embodiment of the present technology.

FIG. 3 is a schematic view of one pixel of the solid-state imaging device according to an embodiment of the present technology.

In the pixel 2 of an example of FIG. 3, a photodiode 56 or a transistor is provided in a silicon (Si) substrate 51, similar to the solid-state imaging device of FIG. 2. A passivation film 52 is formed on the Si substrate 51. In addition, in the example of FIG. 3, while only this passivation film 52 is shown on the incidence-surface side (on the upper side in FIG. 3), an on-chip color filter 35 or an OCL 36 as illustrated in FIG. 2 may be formed. In addition, since the incidence surface is a back surface at the time of formation of the wiring layer and is formed to be turned over, the solid-state imaging device 1 is called a backside illumination type.

A wiring layer 53 is formed beneath the Si substrate 51. A transistor or a wiring is provided in the wiring layer 53. In the Si substrate 51 or the wiring layer 53 beneath the Si substrate 51, an infrared light reading circuit 58 is formed on one side (left in FIG. 3), and a visible light reading circuit 59 is formed on the other side (right in FIG. 3). In addition, an infrared electrode 57 for making contact with a lower substrate 54 is provided to come in contact with the lower substrate 54 on the side facing the lower substrate 54 in the wiring layer 53. The infrared electrode 57 is formed in a ring shape (to be hollow) not to obstruct incidence of the infrared light from the incidence surface (the back surface), as illustrated in FIG. 4.

Figure 4:
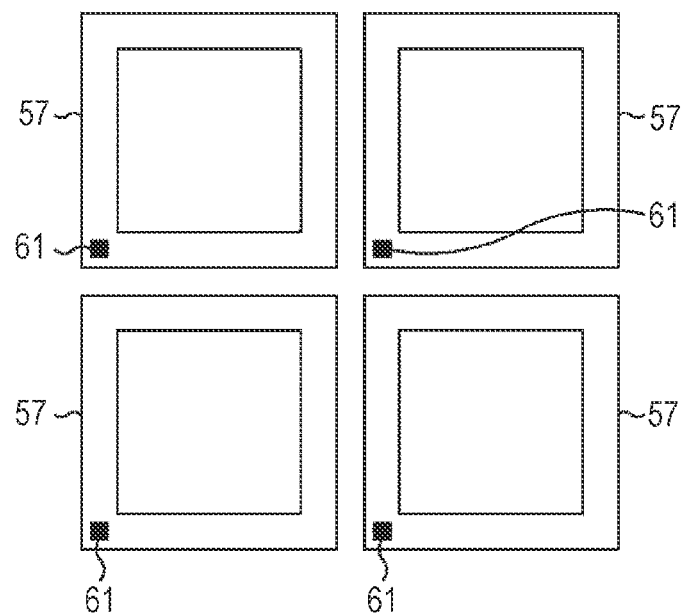
FIG. 4 is a diagram illustrating an example of an infrared electrode.

In the example of FIG. 4, an example of the ring-shaped infrared electrode 57 in the case of 2×2 pixels is shown. A contact 61 for leading to the infrared light reading circuit 58 is formed on the lower left side of each infrared electrode 57.

Infrared light incident from the incidence-surface (back-surface) side passes through a hollow portion of this ring shape. For example, copper or titanium is used for the infrared electrode 57.

In addition, a shape of the infrared electrode 57 is not limited to the ring shape as long as the shape does not obstruct the incidence of the infrared light. For example, the infrared electrode 57 may be a transparent electrode, such as an indium tin oxide (ITO) or a zinc-based material. When the infrared electrode 57 includes the transparent electrode, the infrared electrode 57 may not be a ring shape or may be a shape with no hollow portion (for example, a square).

In the Si substrate 51, the infrared light reading circuit 58 and the visible light reading circuit 59 are arranged in positions substantially (approximately) overlapping the ring-shaped infrared electrode 57.

Further, the lower substrate 54 is a substrate corresponding to the substrate support 39 of FIG. 2, but includes a substrate that photoelectrically converts the infrared light. A lower electrode 55 is provided to come in contact with the lower substrate 54 on a surface of the lower substrate 54 on the side (outer side) opposite to the wiring layer.

In addition, while the lower substrate 54 may be an Si substrate, it is preferable to use a compound semiconductor such as indium gallium arsenide (InGaAs), indium antimonide (InSb), or mercury cadmium telluride (HgCdTe) to form the lower substrate 54. The use of the compound semiconductor for the lower substrate 54 enables the infrared light to be photoelectrically converted in a shallow place of the lower substrate 54, thus increasing resolution of the infrared light.

In the pixel 2 configured in this way, most of the visible light incident from the incidence surface (back surface) is photoelectrically converted by the photodiode 56 provided in the Si substrate 51 having a thickness ranging from 2 µm to 4 µm and read by the visible light reading circuit 59.

On the other hand, most of the infrared light incident from the incidence surface (back surface) penetrates the Si substrate 51 in the pixel 2, passes through the hollow portion of the infrared electrode 57, is photoelectrically converted in the lower substrate 54, and is read in the infrared light reading circuit 58.

In addition, as described above with most of the visible light and most of the infrared light, a part of the visible light is not incident on the photodiode 56 and a part of the infrared light stops in other portions before entering the lower substrate 54. Accordingly, correction may be performed after the photoelectric conversion.

With the configuration as described above, in the solid-state imaging device of a backside illumination type, the visible light and the infrared light can be obtained at substantially the same time (that is, separately). In addition, the visible light and the infrared light can be separately obtained.

Example of Configuration of Visible Light Reading Circuit

Figure 5:
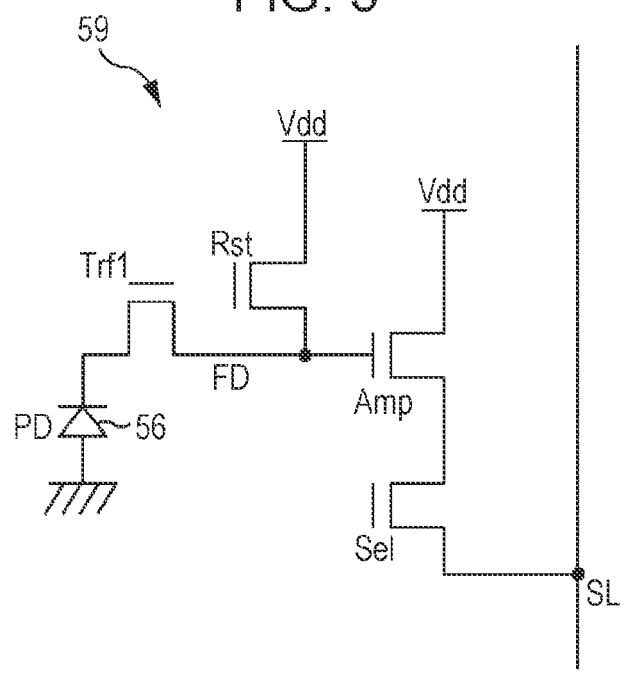
FIG. 5 is a diagram illustrating an example of a configuration of a visible light reading circuit.

FIG. 5 is a diagram illustrating an example of a configuration of the visible light reading circuit of the pixel. In addition, in the example of FIG. 5, transistors in FIG. 5 are all negative channel metal oxide semiconductor (NMOS) ones. The same applies to transistors in the drawings below.

The visible light reading circuit 59 of the pixel 2 includes, for example, a photodiode PD as a photoelectric conversion element, as illustrated in FIG. 5. The visible light reading circuit 59 has a configuration in which four transistors of a transfer transistor Trfl, an amplification transistor Amp, a selection transistor Sel, and a reset transistor Rst are included as active elements for one photodiode PD.

The photodiode PD has a grounded anode, and photoelectrically converts the incident light into an amount of charges (here, electrons) according to an amount of light. The transfer transistor Trfl is connected between a cathode of the photodiode PD and a floating diffusion FD, and a transfer signal is applied to a gate thereof through a transfer wiring (not illustrated). Accordingly, the electrons resulting from the photoelectric conversion in the photodiode PD are transferred to the floating diffusion FD.

A gate of the amplification transistor Amp is connected to the floating diffusion FD. This amplification transistor Amp is connected to the vertical signal line SL via the selection transistor Sel, and constitutes a source follower with a constant current source outside the pixel. Also, a selection signal is applied to a gate of the selection transistor Sel through a selection wiring (not illustrated), and the selection transistor Sel is turned on. In this case, the amplification transistor Amp amplifies a potential of the floating diffusion FD and outputs a voltage according to the potential to the vertical signal line SL. The vertical signal line SL transfers the voltage output from each pixel to the column signal processing circuit 5 of FIG. 1.

The reset transistor Rst is connected between a power supply Vdd and the floating diffusion FD, and a reset signal is applied to a gate thereof through a reset wiring (not illustrated) to reset the potential of the floating diffusion FD to a potential of the power supply Vdd.

Example of Configuration of Infrared Light Reading Circuit

Figure 6:
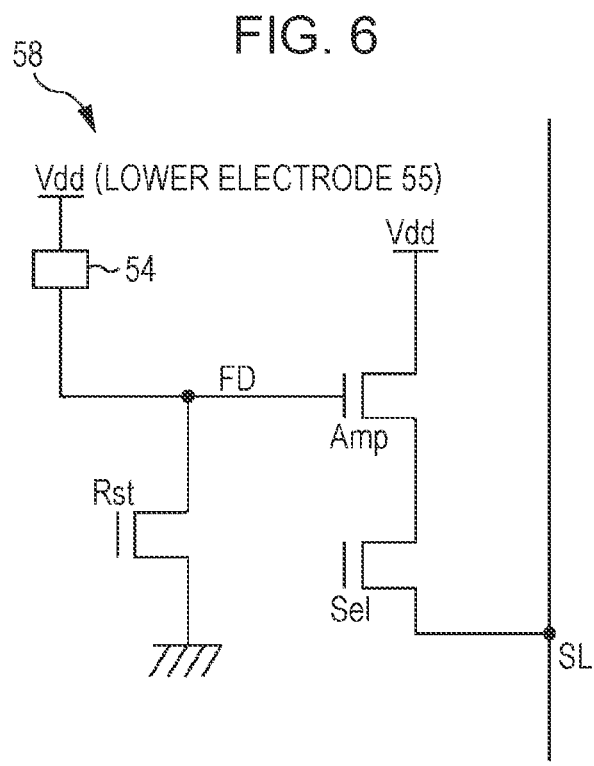
FIG. 6 is a diagram illustrating an example of a configuration of an infrared light reading circuit.

FIG. 6 is a diagram illustrating an example of a configuration of the infrared light reading circuit of the pixel. In the case of an example of FIG. 6, an example in which, in the lower substrate 54, an electric field is applied so as to guide holes to the floating diffusion FD is shown.

The infrared light reading circuit 58 of the pixel 2 includes, for example, the lower substrate 54 of FIG. 3 as a photoelectric conversion unit, as illustrated in FIG. 6. The infrared light reading circuit 58 has a configuration in which three transistors of an amplification transistor Amp, a selection transistor Sel, and a reset transistor Rst are included as active elements for one lower substrate 54.

The lower substrate 54 is connected between the lower electrode 55 and the floating diffusion FD. Also, the lower electrode 55 is set to a high voltage and the floating diffusion FD is reset to ground so as to guide the holes to the floating diffusion FD.

A gate of the amplification transistor Amp is connected to the floating diffusion FD, as in the example of FIG. 5. This amplification transistor Amp is connected to the vertical signal line SL via the selection transistor Sel, and constitutes a source follower with a constant current source outside the pixel. Also, a selection signal is applied to a gate of the selection transistor Sel through a selection wiring (not illustrated), and the selection transistor Sel is turned on. In this case, the amplification transistor Amp amplifies a potential of the floating diffusion FD and outputs a voltage according to this potential to the vertical signal line SL. The vertical signal line SL transfers a voltage output from each pixel to the column signal processing circuit 5 of FIG. 1.

The reset transistor Rst is connected between the ground and the floating diffusion FD, and a reset signal is applied to a gate thereof through a reset wiring (not illustrated) to reset the potential of the floating diffusion FD to the ground.

In this example, a technology for providing a hole injection barrier on the lower electrode 55 side of the lower substrate 54 and an electron injection barrier on the infrared electrode 57 side, for example, to reduce a dark current can be used.

In addition, the infrared light reading circuit is not limited to the example of FIG. 6 and may be the same as that of a normal solid-state imaging device of a photoelectric conversion film lamination type.

Example of Configuration of Infrared Light Reading Circuit

Figure 7:
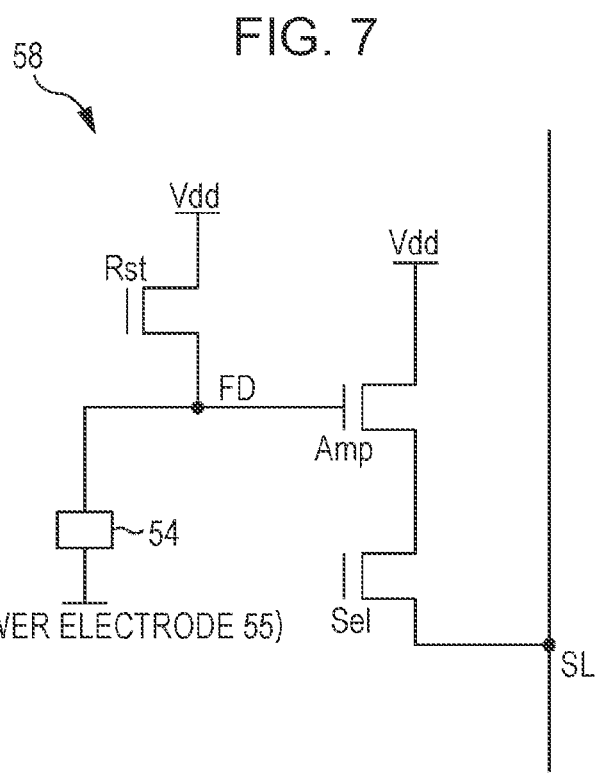
FIG. 7 is a diagram illustrating another example of a configuration of the infrared light reading circuit.

FIG. 7 is a diagram illustrating another example of the configuration of the infrared light reading circuit of the pixel. In the case of the example of FIG. 7, an example in which, in the lower substrate 54, an electric field is applied so as to guide electrons to the floating diffusion FD is shown.

An infrared light reading circuit 58 of the pixel 2 includes, for example, the lower substrate 54 of FIG. 3 as a photoelectric conversion unit, as illustrated in FIG. 7. The infrared light reading circuit 58 has a configuration in which three transistors of an amplification transistor Amp, a selection transistor Sel, and a reset transistor Rst are included as active elements for one lower substrate 54.

The lower substrate 54 is connected to between a lower electrode 55 and a floating diffusion FD, as in the example of FIG. 6. In the lower substrate 54, the lower electrode 55 is set to a negative voltage and the floating diffusion FD is reset to a power supply voltage Vdd to guide the electrons to the floating diffusion FD, unlike the example of FIG. 6.

A gate of the amplification transistor Amp is connected to the floating diffusion FD, as in the example of FIG. 6. This amplification transistor Amp is connected to the vertical signal line SL via the selection transistor Sel, and constitutes a source follower with a constant current source outside the pixel. Also, a selection signal is applied to a gate of the selection transistor Sel through a selection wiring (not illustrated). When the selection transistor Sel is turned on, the amplification transistor Amp amplifies a potential of the floating diffusion FD and outputs a voltage according to the potential to the vertical signal line SL. The vertical signal line SL transfers the voltage output from each pixel to the column signal processing circuit 5 of FIG. 1.

The reset transistor Rst is connected between the power supply voltage Vdd and the floating diffusion FD. Also, the reset transistor Rst resets the potential of the floating diffusion FD to the power supply voltage Vdd when a reset signal is applied to the gate thereof through a reset wiring (not illustrated), unlike the example of FIG. 6.

In the case of this example, a technology of providing an electron injection barrier on the lower electrode 55 side of the lower substrate 54 and a hole injection barrier on the infrared electrode 57 side, for example, to reduce a dark current can be used.

Process of Manufacturing Solid-State Imaging Device

Next, a process of manufacturing the solid-state imaging device (the pixel of FIG. 3) will be described with reference to a flowchart of FIG. 8 and process diagrams of FIGS. 9A to 10B. In addition, this process is a process to be performed by a manufacturing device for manufacturing a solid-state imaging device.

Figure 9A:
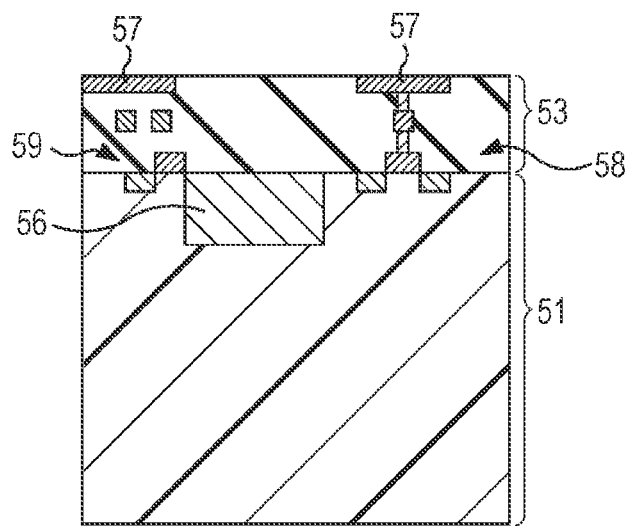
FIGS. 9A and 9B are diagrams illustrating a process of manufacturing a solid-state imaging device.

First, in step S51 of FIG. 5, the manufacturing device forms the photodiode 56, the transistors, and the wirings (including the infrared electrode 57) in the Si substrate 51. Here, the photodiode 56, the transistors, and the wiring layer 53 are formed in the Si substrate 51, and a top layer becomes the infrared electrode 57, as illustrated in FIG. 9A.

Figure 9B:
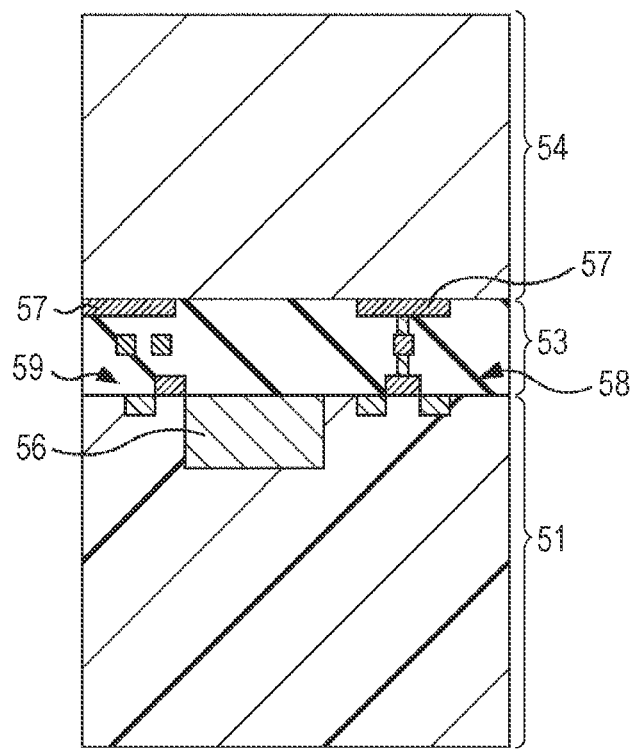

In step S52, the manufacturing device affixes the lower substrate 54 on the wiring layer 53, as illustrated in FIG. 9B.

Figure 10A:
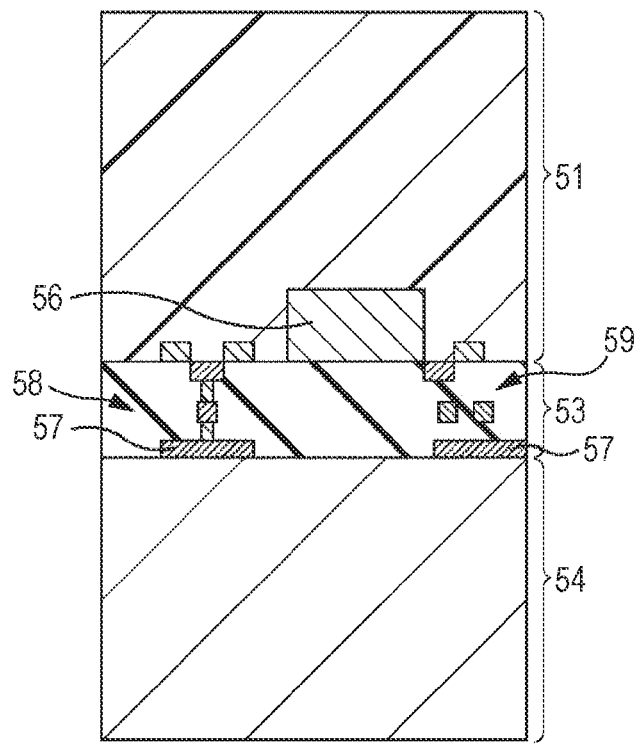
FIGS. 10A and 10B are diagrams illustrating a process of manufacturing a solid-state imaging device.

In step S53, the manufacturing device turns over the wafer (Si substrate 51), as illustrated in FIG. 10A.

Figure 10B:
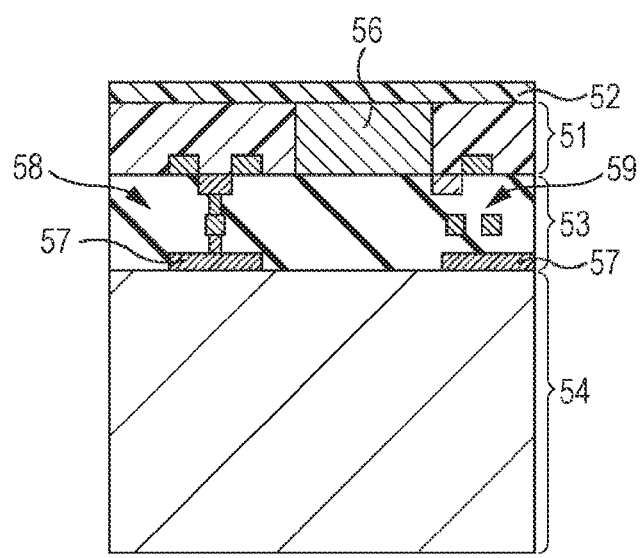

In step S54, the manufacturing device shaves the Si substrate 51 to a thickness of several μm to form a passivation film 52, as illustrated in FIG. 10B.

In step S55, the manufacturing device performs backside processing on the lower substrate 54.

In addition, the lower electrode 55 illustrated in FIG. 3 may be formed in the process of step S55, or may not be formed in this chip but may be provided on the package side. In this case, affixing to the package with an electrode enables electrical conduction.

2. Second Embodiment

Backside Illumination Type Laminated CIS

Next, the solid-state imaging device of a backside illumination type includes a device in which transistors/wirings, that is, a circuit is mounted in an Si substrate that is a substrate support. Such a device will be described.

Example of Schematic Basic Configuration of Solid-State Imaging Device

Figure 11A:
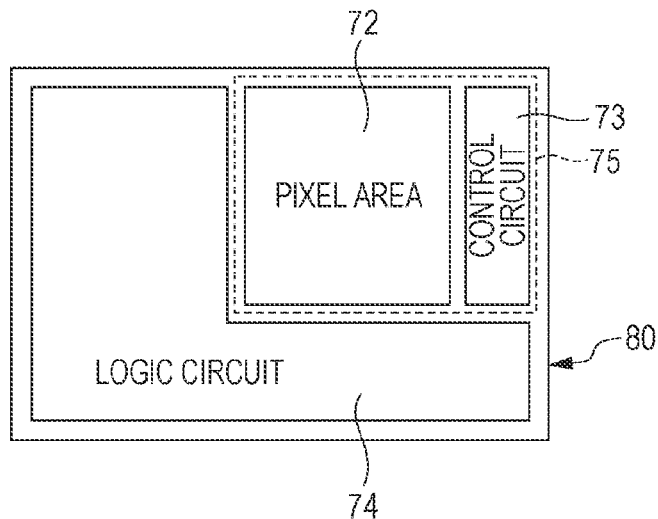
FIGS. 11A, 11B and 11C illustrate a basic schematic configuration of a solid-state imaging device according to an embodiment of the present technology.
Figure 11B:
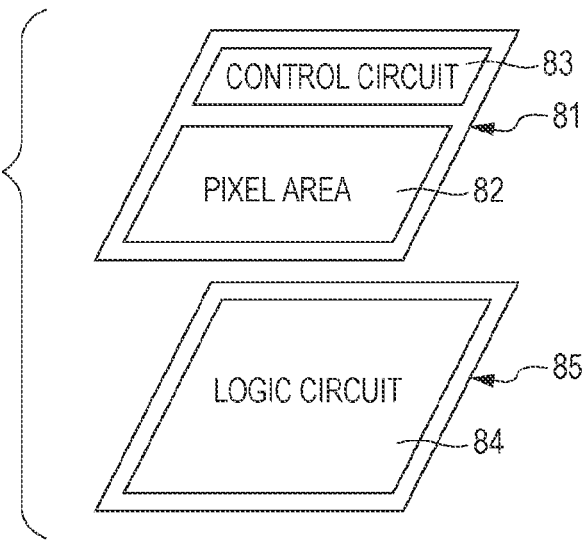
Figure 11C:
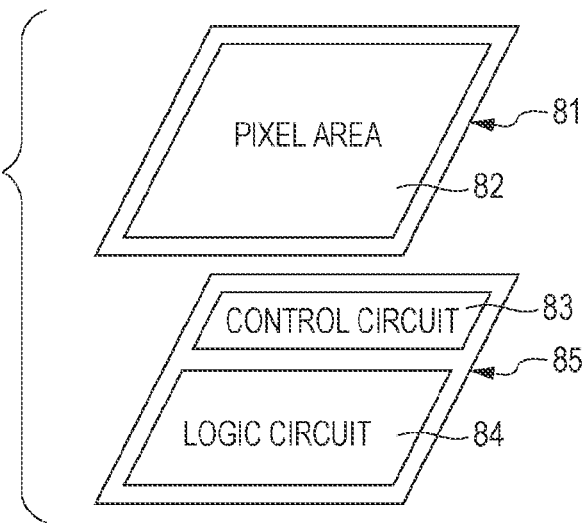

FIGS. 11A, 11B and 11C are diagrams illustrating a basic schematic configuration of a solid-state imaging device according to another embodiment of the present technology.

A solid-state imaging device illustrated in FIG. 11A includes a pixel area 72, a control circuit 73, and a logic circuit 74 for signal processing that are mounted in one semiconductor chip 80. Usually, an image sensor 75 includes the pixel area 72 and the control circuit 73.

On the other hand, in a solid-state imaging device in another embodiment of the present technology, a pixel area 82 and a control circuit 83 are mounted in a first semiconductor chip portion 81, and a logic circuit 84 including a signal processing circuit for signal processing is mounted in a second semiconductor chip portion 85, as illustrated in FIG. 11B. In addition, the vertical driving circuit 4, the horizontal driving circuit 6, and the control circuit 8 of FIG. 1, for example, are included in the control circuit 83. In addition, a signal processing circuit for performing signal processing, such as correction or gain, on the output from the output circuit 7 of FIG. 1, for example, is included in the logic circuit 84.

On the other hand, in a solid-state imaging device in another embodiment of the present technology, a pixel area 82 is mounted on a first semiconductor chip portion 81, and a control circuit 83 and a logic circuit 84 including a signal processing circuit are mounted on a second semiconductor chip portion 85, as illustrated in FIG. 11C.

Also, the first and second semiconductor chip portions 81 and 85 are electrically connected to each other to constitute a solid-state imaging device as one semiconductor chip.

In addition, a configuration of the solid-state imaging device is not limited to FIGS. 11B and 11C. For example, some of the control circuit 83 (for example, the vertical driving circuit 4, the horizontal driving circuit 6, and the control circuit 8) are included in the first semiconductor chip portion 81, and the others of the control circuit 83 are included in the second semiconductor chip portion 85. For example, the vertical driving circuit 4 and the horizontal driving circuit 6 may be included as the some in the first semiconductor chip portion 81, and the others may be included in the second semiconductor chip portion 85, or only the vertical driving circuit 4 (or the horizontal driving circuit 6) may be included in the first semiconductor chip portion 81 and the others may be included in the second semiconductor chip portion 85. In addition, the second semiconductor chip portion 85 may include a memory circuit that stores, for example, a signal input by the pixel area or data of a signal processing result.

For example, the second semiconductor chip portion 85 may include both the logic circuit 84 and the memory circuit.

Figure 12A:
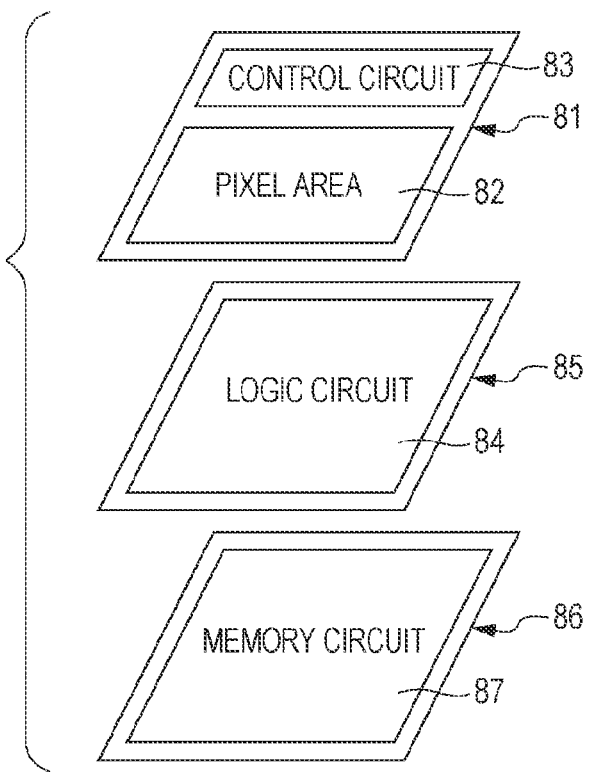
FIGS. 12A and 12B illustrate a basic schematic configuration of a solid-state imaging device according to an embodiment of the present technology.
Figure 12B:
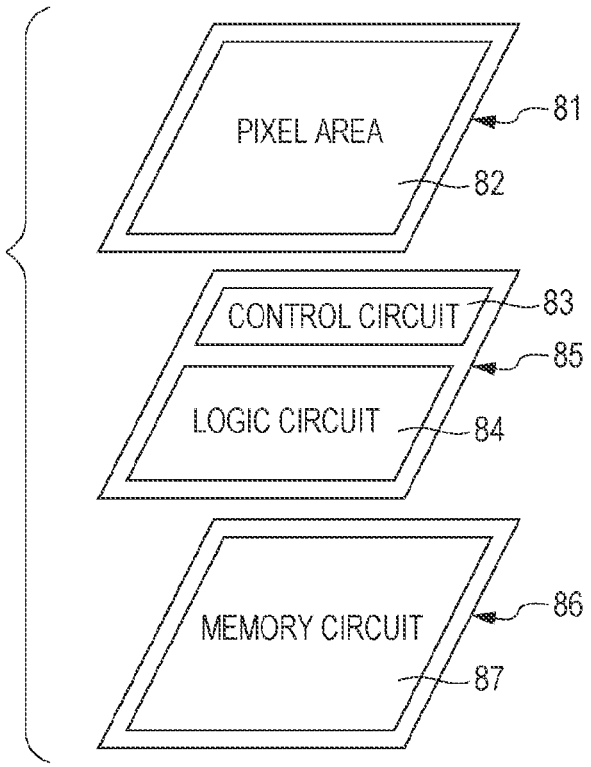

Further, in a solid-state imaging device in another embodiment of the present technology, three layers of semiconductor chip portions are electrically connected to one another to constitute one semiconductor chip, as illustrated in FIGS. 12A and 12B.

In other words, in the solid-state imaging device in another embodiment of the present technology, a pixel area 82 and a control circuit 83 are mounted on a first semiconductor chip portion 81, and a logic circuit 84 including a signal processing circuit that performs signal processing is mounted on a second semiconductor chip portion 85, as illustrated in FIG. 12A. Further, in the solid-state imaging device, a memory circuit 87 that stores a signal input by the pixel area or data of a signal processing result is mounted on a third semiconductor chip portion 86, as illustrated in FIG. 12A.

Alternatively, in a solid-state imaging device in another embodiment of the present technology, a pixel area 82 is mounted on a first semiconductor chip portion 81, and a control circuit 83 and a logic circuit 84 including a signal processing circuit are mounted on a second semiconductor chip portion 85, as illustrated in FIG. 12B. Further, in the solid-state imaging device, a memory circuit 87 is mounted on a third semiconductor chip portion 86, as illustrated in FIG. 12B.

Also, the first semiconductor chip portion 81, the second semiconductor chip portion 85, and the third semiconductor chip portion 86 are electrically connected to one another to constitute a solid-state imaging device as one semiconductor chip.

In addition, even in the example of FIGS. 12A and 12B, in the configuration of each unit included in the control area, for example, some in the control circuit 83 may be included in the first semiconductor chip portion 81, and the others in the control circuit 83 may be included in the second semiconductor chip portion 85, as in the configuration of the control area described above with reference to FIGS. 11A, 11B and 11C. In addition, in the example of FIGS. 12A and 12B, a memory circuit may be mounted on the second semiconductor chip portion 85. In addition, a logic circuit may be mounted on the third semiconductor chip portion 86. For example, both the logic circuit 84 and the memory circuit may be mounted on the second semiconductor chip portion 85 or the third semiconductor chip portion 86.

As described above, the solid-state imaging devices in the other embodiments of the present technology are configured by laminating the semiconductor chips (semiconductor substrates). In addition, while an example in which two layers and three layers of semiconductor chips are laminated will be described below, the number of laminated layers is not limited to 2 or 3, and may be 4, 5 or greater.

Example of Configuration of Pixel of Solid-State Imaging Device

Figure 13:
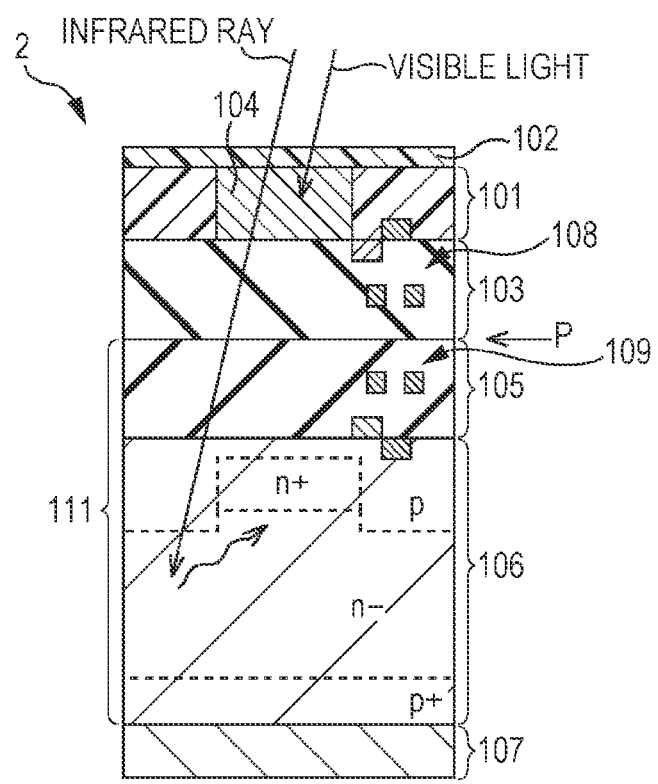
FIG. 13 is a cross-sectional view illustrating an example of a configuration of a pixel of a solid-state imaging device of another embodiment of the present technology.

FIG. 13 is a schematic view of one pixel of a solid-state imaging device according to another embodiment of the present technology.

In a pixel 2 of FIG. 13, a silicon (Si) substrate A 101 forms a laminated structure with a lower substrate 111. A photodiode 104 or a transistor is provided in the Si substrate A 101, and a passivation film 102 is formed on the Si substrate A 101, as in the example of FIG. 3. In addition, even in the case of the example of FIG. 13, an on-chip color filter 35 or an OCL 36 as illustrated in FIG. 2 may be formed on the incidence surface (top in FIG. 13; back surface).

A wiring layer 103 is formed beneath the Si substrate A 101. Transistors or wirings are provided in the wiring layer 103. In the Si substrate A 101 and the wiring layer 103 beneath the Si substrate A 101, a visible light reading circuit 108 is formed on the right side in FIG. 13. The visible light reading circuit 108 is configured similar to the visible light reading circuit 59 of FIG. 4. In addition, an infrared light reading circuit 109 is formed in the lower substrate 111, unlike the example of FIG. 3.

The lower substrate 111 is a silicon (Si) substrate in which the transistors and the wirings are formed. The lower substrate 111 is configured to include a wiring layer 105, an Si substrate B 106, and a lower electrode 107.

The Si substrate B 106 is a thin, n-type substrate formed of Si, and a transistor, for example, is provided. Transistors or wirings are provided in the wiring layer 105 formed on the upper side in FIG. 13 of the Si substrate B 106. In the Si substrate B 106 and the wiring layer 105 on the Si substrate B 106, the infrared light reading circuit 109 is provided in a position substantially overlapping the visible light reading circuit 108. Accordingly, it is possible to decrease a size of the pixel.

In addition, the infrared light reading circuit 109 can be configured similar to the visible light reading circuit 59 described above with reference to FIG. 4. In this case, since a buried photodiode handling electrons can be used, it is possible to reduce noise.

Since the infrared light is photoelectrically converted over the entire Si substrate B 106 of tens of µm to hundreds of µm rather than several µm, a negative voltage is applied to the lower electrode 107 to collect the infrared light in an upper n+ portion, and thus an electric field is generated in the Si substrate B 106.

With the configuration as described above, even in the laminated solid-state imaging device of a backside illumination type, the visible light and the infrared light can be obtained at substantially the same time. In addition, it is possible to separately obtain the visible light and the infrared light.

Process of Manufacturing Solid-State Imaging Device

Next, a process of manufacturing a solid-state imaging device (the pixel of FIG. 13) will be described with reference to a flowchart of FIG. 14 and a process diagram of FIGS. 15A to 15E. In addition, this process is a process to be performed by a manufacturing device for manufacturing a solid-state imaging device.

Figure 14:
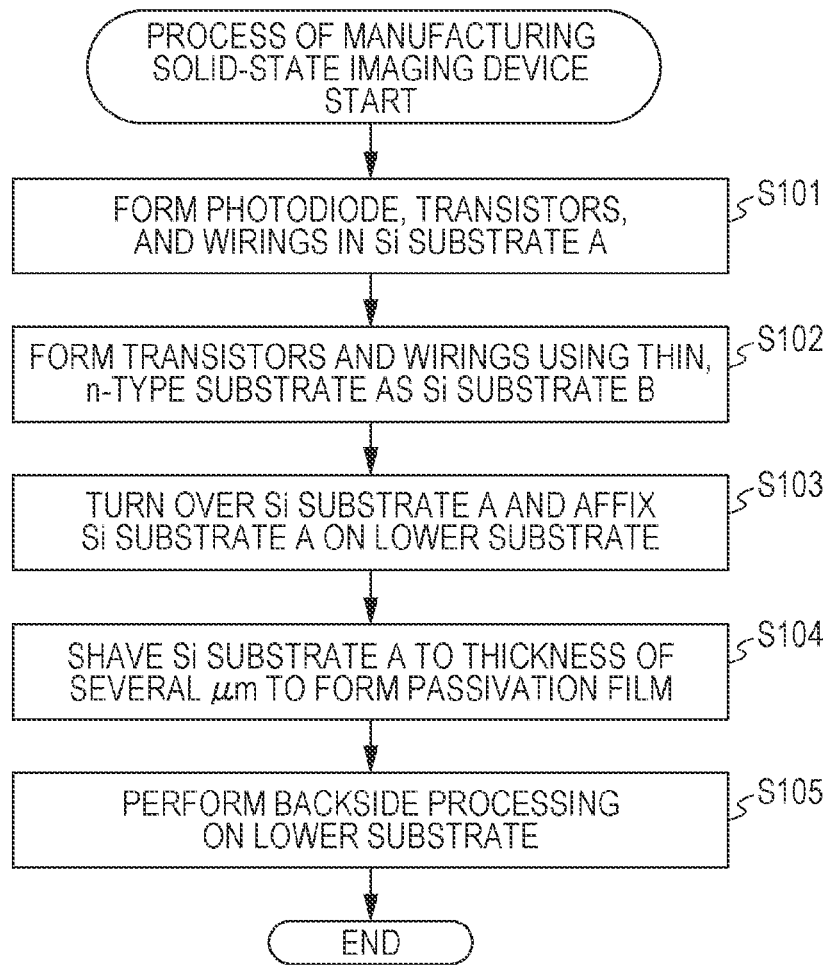
FIG. 14 is a flowchart illustrating a process of manufacturing the solid-state imaging device.

First, in step S101 of FIG. 14, the manufacturing device forms a photodiode 104, transistors, and wirings in an Si substrate A 101. Here, the photodiode 104, the transistors, and a wiring layer 103 are formed in the Si substrate A 101, as illustrated in FIG. 15A.

In step S102, the manufacturing device forms the transistors and wirings using a thin, n-type substrate as an Si substrate B 106. Accordingly, a lower substrate 111 in which a wiring layer 105 is formed in the Si substrate B 106 is obtained, as illustrated in FIG. 15B.

Figure 15:
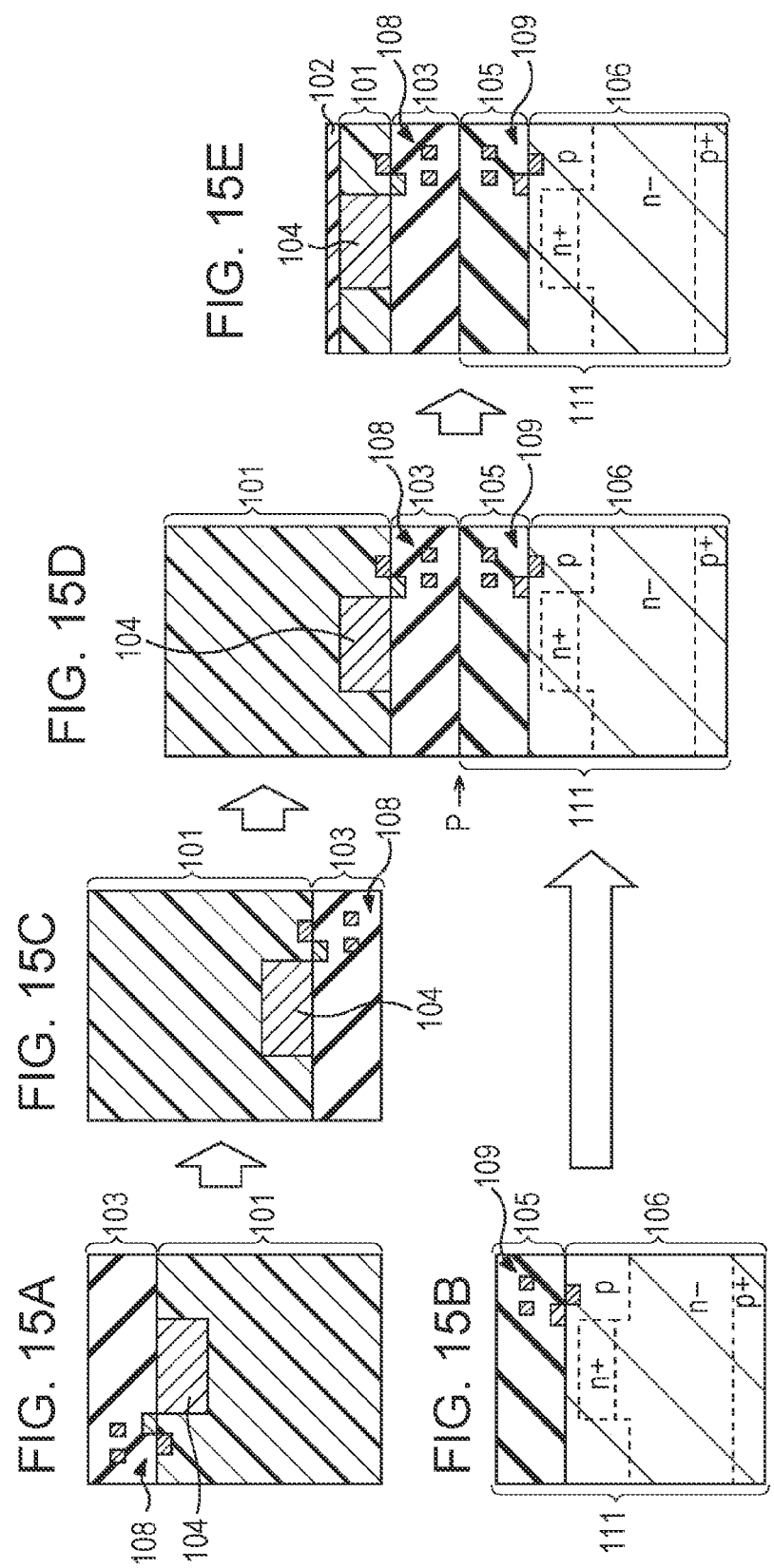
FIGS. 15A to 15E are diagrams illustrating a process of manufacturing a solid-state imaging device.

In step S103, the manufacturing device turns over the Si substrate A 101 as illustrated in FIG. 15C, and affix the Si substrate A 101 on the lower substrate 111 in an arrow P of FIG. 15D.

In step S104, the manufacturing device shaves the Si substrate A 101 to a thickness of several µm to form a passivation film 102, as illustrated in FIG. 10E.

In step S105, the manufacturing device performs backside processing on the lower substrate 111.

In addition, the lower electrode 107 illustrated in FIG. 13 may be formed in the process of step S105, or may not be formed in this chip but may be provided on the package side. In this case, affixing to the package with an electrode enables electrical conduction.

The present technology can be implemented in various other forms. For example, while all the pixels 2 have been described as taking the visible light and the infrared light in the above description, the infrared light may be acquired by one pixel in a plurality of visible pixels (for example, four pixels).

In addition, while the example in which the visible light and the infrared light are obtained at the same time by releasing one electronic shutter has been described in the description described above, separate electronic shutters can be released in the visible light and the infrared light to obtain different exposure time.

Further, while a part of the infrared light is mixed on the Si-substrate side and a part of the visible light is mixed on the lower-substrate side, correction from each other's signals is in preparation since the lights are signals at the same time in the same position. In addition, the lower substrate is described above because this lower substrate may not have to serve as a substrate support in a technology such as lamination of three substrate layers.

In addition, the present technology, for example, is not limited to application to the solid-state imaging device, such as an image sensor. In other words, the present technology is applicable to all electronic apparatuses in which a solid-state imaging device is used in an image acquisition unit (photoelectric conversion unit), such as an imaging device such as a digital still camera or a video camera, a portable terminal device having an imaging function, and a copier using a solid-state imaging device in an image reading unit.

3. Third Embodiment

Example of Configuration of Electronic Apparatus

Figure 16:
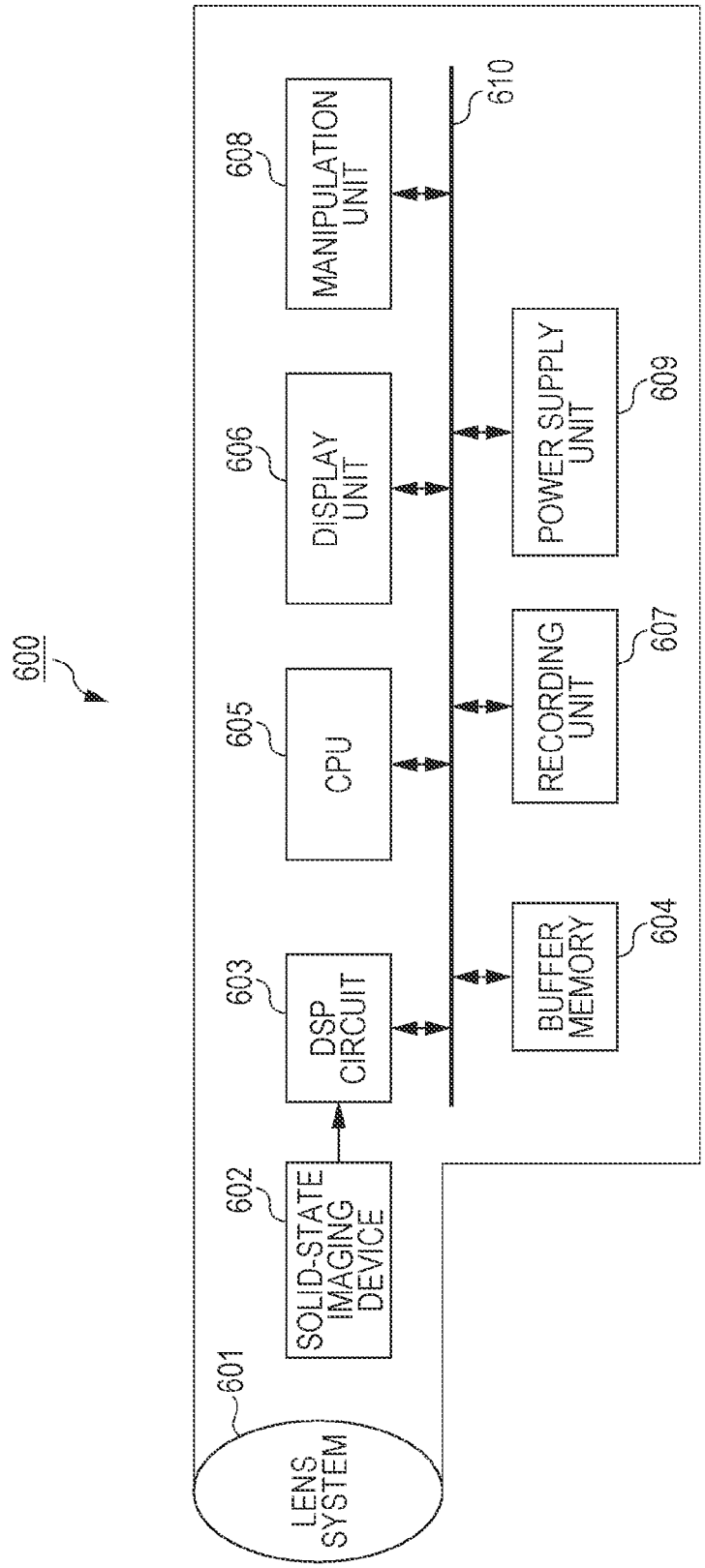
FIG. 16 is a block diagram illustrating an example of a configuration of an electronic apparatus of an embodiment of the present technology.

FIG. 16 is a block diagram illustrating an example of a configuration of a camera device as the electronic apparatus to which an embodiment of the present technology is applied.

A camera device 600 of FIG. 16 includes an optical unit 601 including, for example, a lens group, a solid-state imaging device (imaging device) 602 in which each configuration of the pixel 2 described above is adopted, and a DSP circuit 603 that is a camera signal processing circuit. In addition, the camera device 600 further includes a buffer memory 604, a CPU 605, a display unit 606, a recording unit 607, a manipulation unit 608, and a power supply unit 609. The DSP circuit 603, the buffer memory 604, the CPU 605, the display unit 606, the recording unit 607, the manipulation unit 608, and the power supply unit 609 are connected to one another through a bus line 610.

The optical unit 601 acquires incident light (image light) from a subject and forms an image on an imaging surface of the solid-state imaging device 602. The solid-state imaging device 602 converts a light amount of incident light of the image formed on the imaging surface by the optical unit 601 into an electrical signal in units of pixels and outputs the electrical signal as a pixel signal. The solid-state imaging device according to the embodiment described above may be used as this solid-state imaging device 602. Accordingly, in the camera device 600, two solid-state imaging devices do not have to be provided since visible light and infrared light are obtained in one solid-state imaging device. Thus, it is possible to decrease a cost and a size of the device.

An image signal-processed by the DSP circuit 603, or the like is recorded in the buffer memory 604. The CPU 605 controls each unit of the camera device 600.

The display unit 606 includes, for example, a display device of a panel type such as a liquid crystal panel or an organic electro luminescence (EL) panel, and displays a moving image or a still image captured by the solid-state imaging device 602. The recording unit 607 records the moving image or the still image captured by the solid-state imaging device 602 in a recording medium, such as a video tape or a digital versatile disk (DVD).

The manipulation unit 608 issues a manipulation instruction for various functions of the camera device 600 under a manipulation by the user. The power supply unit 609 appropriately supplies various supply voltages that are operation voltages of the DSP circuit 603, the buffer memory 604, the CPU 605, the display unit 606, the recording unit 607, and the manipulation unit 608 to these supply targets.

In addition, in the present specification, the steps describing the series of processes described above include not only processes that are performed in time series in the described order, but also processes that are executed in parallel or individually, instead of being necessarily processed in time series.

Further, embodiments in the present disclosure are not limited to the embodiments described above and various changes can be made without departing from the gist of the present disclosure.

In addition, the respective steps described in the above-described flowchart can be not only executed by one device, but also executed in cooperation by a plurality of devices.

Further, when a plurality of processes are to be included in one step, the plurality of processes included in one step can be not only executed by one device, but also executed in cooperation by a plurality of devices.

Further, the configuration described above as one device (or processing unit) may be divided into a plurality of devices (or processing units). On the contrary, the configuration described above as a plurality of devices (or processing units) may be combined into one device (or processing unit). Further, it is understood that a configuration other than the configuration described above may be added to the configuration of each device (or each processing unit). Further, if a configuration or an operation of an entire system is substantially the same, a part of the configuration of any device (or processing unit) may be included in a configuration of another device (or another processing unit). In other words, the present technology is not limited to the embodiments described above and various changes can be made without departing from the gist of the present technology.

While the preferred embodiments of the present disclosure have been described in detail with reference to the accompanying drawings, the disclosure is not limited to such examples. It is apparent that various variations or modifications can be conceived by those skilled in the art in the category of technical ideas of the claims, and it is understood that the variations or modifications belong to the technical scope of the present disclosure.

In addition, the present technology can also take the following configurations.

(1) A solid-state imaging device including an Si substrate in which a photoelectric conversion unit that photoelectrically converts visible light incident from a back surface side is formed; and a lower substrate provided under the Si substrate and configured to photoelectrically convert infrared light incident from the back surface side.

(2) The solid-state imaging device according to (1), wherein the lower substrate is formed of a compound semiconductor.

(3) The solid-state imaging device according to (1) or (2), wherein an infrared electrode comes in contact with the Si substrate side of the lower substrate, and a lower electrode comes in contact with the outer side of the lower substrate.

(4) The solid-state imaging device according to any one of (1) to (3), wherein a visible light reading circuit configured to read the visible light and an infrared light reading circuit configured to read the infrared light are formed in the Si substrate.

(5) The solid-state imaging device according to (3) or (4), wherein the infrared electrode is formed in a ring shape.

(6) The solid-state imaging device according to any one of (3) to (5), wherein the visible light reading circuit and the infrared light reading circuit are formed in a position substantially overlapping the infrared electrode.

(7) The solid-state imaging device according to (3), wherein the infrared electrode is formed to be transparent.

(8) The solid-state imaging device according to (1), wherein the lower substrate is formed of silicon, and includes transistors and wirings.

(9) The solid-state imaging device according to (8), wherein the lower substrate is an n-type substrate.

(10) The solid-state imaging device according to (8) or (9), wherein the Si substrate and the lower substrate form a laminated structure.

(11) The solid-state imaging device according to (10), wherein a visible light reading circuit configured to read the visible light is formed in the Si substrate, and an infrared light reading circuit configured to read the infrared light is formed in the lower substrate.

(12) The solid-state imaging device according to (10) or (11), wherein the infrared light reading circuit is provided in a position substantially overlapping the visible light reading circuit.

(13) A method of manufacturing a solid-state imaging device, the method including: forming, by a manufacturing device, a photoelectric conversion unit that photoelectrically converts visible light incident from a back surface side, in an Si substrate; and affixing, by a manufacturing device, a lower substrate that photoelectrically converts infrared light incident from the back surface side, under the Si substrate.

(14) An electronic apparatus including: a solid-state imaging device including an Si substrate in which a photoelectric conversion unit that photoelectrically converts visible light incident from a back surface side is formed, and a lower substrate provided under the Si substrate and configured to photoelectrically convert infrared light incident from the back surface side; a signal processing circuit configured to process an output signal output from the solid-state imaging device; and an optical system configured to cause the visible light and the infrared light to be incident on the solid-state imaging device.

(15) The electronic apparatus according to (14), wherein the lower substrate is formed of a compound semiconductor.

(16) The electronic apparatus according to (14), wherein an infrared electrode comes in contact with the Si substrate side of the lower substrate, and a lower electrode comes in contact with the outer side of the lower substrate.

(17) The electronic apparatus according to any one of (14) to (16), wherein a visible light reading circuit configured to read the visible light and an infrared light reading circuit configured to read the infrared light are formed in the Si substrate.

(18) The electronic apparatus according to (16) or (17), wherein the infrared electrode is formed in a ring shape.

(19) The electronic apparatus according to (17) or (18), wherein the visible light reading circuit and the infrared light reading circuit are formed in a position substantially overlapping the infrared electrode.

(20) The electronic apparatus according to (16), (17) or (19), wherein the infrared electrode is formed to be transparent.

(21) The electronic apparatus according to (14), wherein the lower substrate is formed of silicon, and includes transistors and wirings.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
    an Si substrate in which a photoelectric conversion unit that photoelectrically converts visible light incident from a back surface side is formed; and
    a lower substrate provided under the Si substrate and configured to photoelectrically convert infrared light incident from the back surface side, wherein an infrared electrode comes in contact with the Si substrate side of the lower substrate, and a lower electrode comes in contact with an outer side of the lower substrate, wherein the Si substrate and the lower substrate form a laminated structure, and wherein a visible light reading circuit configured to read the visible light is formed in a first wiring layer and the Si substrate, and an infrared light reading circuit configured to read the infrared light is formed in the lower substrate.

2. The solid-state imaging device according to claim 1, wherein the lower substrate is formed of a compound semiconductor.

3. The solid-state imaging device according to claim 1 wherein a visible light reading circuit configured to read the visible light and an infrared light reading circuit configured to read the infrared light are formed in the Si substrate.

4. The solid-state imaging device according to claim 3, wherein the infrared electrode is formed in a ring shape.

5. The solid-state imaging device according to claim 4, wherein the visible light reading circuit and the infrared light reading circuit are formed in a position substantially overlapping the infrared electrode.

6. The solid-state imaging device according to claim 1 wherein the infrared electrode is formed to be transparent.

7. The solid-state imaging device according to claim 1, wherein the lower substrate is formed of silicon, and includes transistors and wirings.

8. The solid-state imaging device according to claim 7, wherein the lower substrate is an n-type substrate.

9. The solid-state imaging device according to claim 1 wherein the infrared light reading circuit is provided in a position substantially overlapping the visible light reading circuit.

10. An electronic apparatus comprising:
    a solid-state imaging device including an Si substrate in which a photoelectric conversion unit that photoelectrically converts visible light incident from a back surface side is formed, and a lower substrate provided under the Si substrate and configured to photoelectrically convert infrared light incident from the back surface side, wherein an infrared electrode comes in contact with the Si substrate side of the lower substrate, and a lower electrode comes in contact with an outer side of the lower substrate, and wherein a visible light reading circuit configured to read the visible light and an infrared light reading circuit configured to read the infrared light are formed in the Si substrate;
    a signal processing circuit configured to process an output signal output from the solid-state imaging device; and
    an optical system configured to cause the visible light and the infrared light to be incident on the solid-state imaging device.

11. The electronic apparatus according to claim 10, wherein the lower substrate is formed of a compound semiconductor.

12. The electronic apparatus according to claim 10 wherein the infrared electrode is formed in a ring shape.

13. The electronic apparatus according to claim 12, wherein the visible light reading circuit and the infrared light reading circuit are formed in a position substantially overlapping the infrared electrode.

14. The electronic apparatus according to claim 10 wherein the infrared electrode is formed to be transparent.

15. The electronic apparatus according to claim 10, wherein the lower substrate is formed of silicon, and includes transistors and wirings.

* * * * *